(12) United States Patent
Park

(10) Patent No.: US 11,056,675 B2
(45) Date of Patent: Jul. 6, 2021

(54) DISPLAY PANEL AND DISPLAY DEVICE COMPRISING THE SAME

(71) Applicant: LG Display Co., Ltd., Seoul (KR)

(72) Inventor: JongHyun Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/942,176

(22) Filed: Jul. 29, 2020

(65) Prior Publication Data

US 2021/0143366 A1    May 13, 2021

(30) Foreign Application Priority Data

Nov. 11, 2019  (KR) .......................... 10-2019-0143265

(51) Int. Cl.
| | | |
|---|---|---|
| *H01L 27/32* | (2006.01) | |
| *H01L 51/52* | (2006.01) | |
| *G06F 3/044* | (2006.01) | |
| *G06F 3/041* | (2006.01) | |

(52) U.S. Cl.
CPC ........ *H01L 51/5253* (2013.01); *G06F 3/0412* (2013.01); *G06F 3/0443* (2019.05); *H01L 27/323* (2013.01); *H01L 27/3244* (2013.01); *G06F 3/0446* (2019.05); *G06F 2203/04111* (2013.01); *G06F 2203/04112* (2013.01)

(58) Field of Classification Search
None
See application file for complete search history.

(56) References Cited

U.S. PATENT DOCUMENTS

2015/0241908 A1*  8/2015  Ozyilmaz ............. G06F 3/0443
                                                                345/174

FOREIGN PATENT DOCUMENTS

CN          109665515 A  *  4/2019

* cited by examiner

*Primary Examiner* — Duane N Taylor, Jr.
(74) *Attorney, Agent, or Firm* — Seed IP Law Group LLP

(57) ABSTRACT

The present disclosure relates to display panels and display devices including the display panel, and more specifically, to display panels including a protective layer, a graphene layer, a pressure sensitive adhesive layer, and a macromolecule film, on one surface of which a nano-pattern is formed, and display devices including the display panel. As results, the display panels and the display devices are provided that have high light extraction efficiency, excellent moisture permeability resistance, and a thin bezel.

20 Claims, 14 Drawing Sheets

*FIG.11*
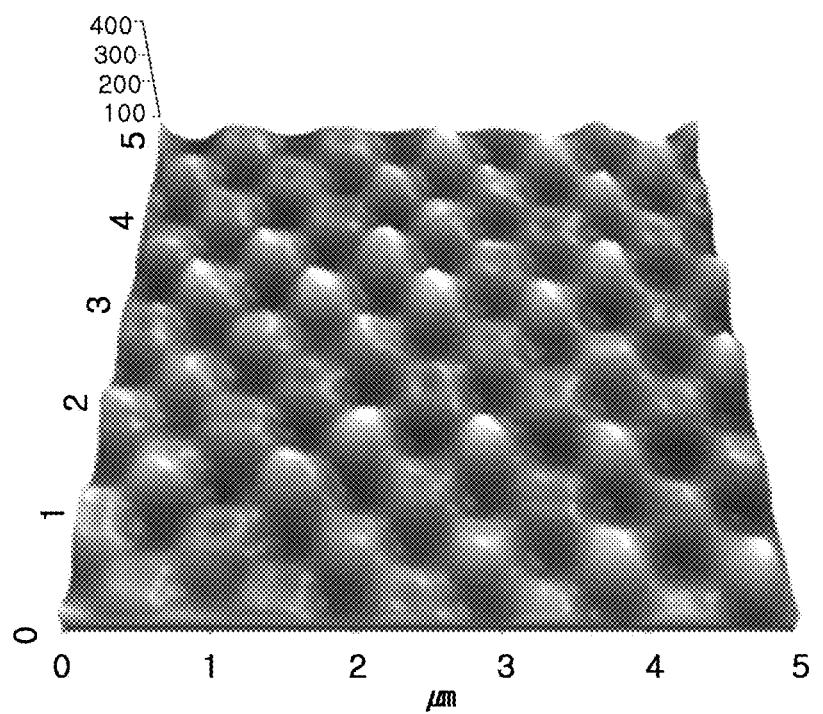
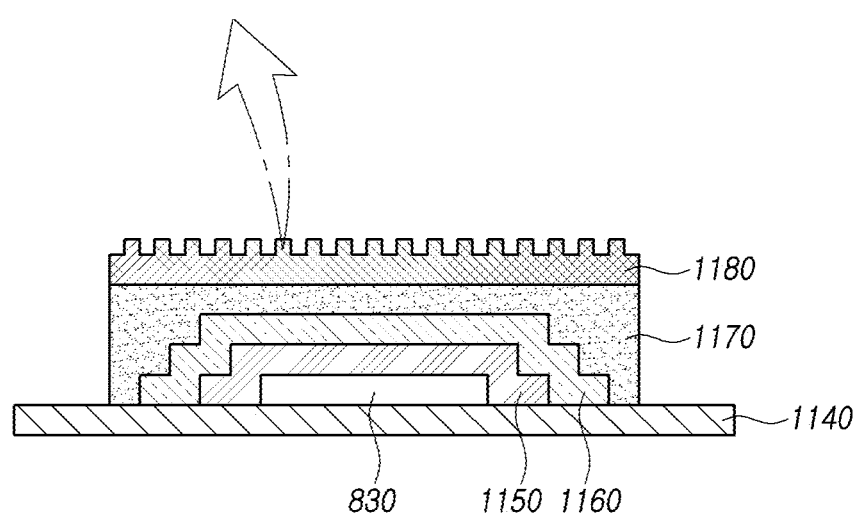

DISPLAY PANEL AND DISPLAY DEVICE COMPRISING THE SAME

CROSS-REFERENCE TO RELATED APPLICATION

This application claims the priority benefit of Korean Patent Application No. 10-2019-0143265, filed on Nov. 11, 2019 in the Korean Intellectual Property Office, the disclosure of which is incorporated herein by reference in its entirety.

BACKGROUND

Technical Field

The present disclosure relates to display panels and display devices including the display panel, more specifically, to display panels having high light extraction efficiency, excellent moisture permeability resistance, and a thin bezel, and display devices including the display panel.

Description of the Related Art

As the advent of information society, there have been growing needs for display devices for displaying images. In recent years, a range of display devices, such as a liquid crystal display (LCD), a plasma display panel (PDP) device, an organic light emitting display (OLED) device, or the like, have been developed and utilized.

Recently, there has been increasing importance for external design of display devices that can satisfy the user's aesthetics, as well as display quality. In order to realize an aesthetically pleasing design, it is desirable for the display device to have a thin bezel, but it is not easy to reduce the thickness of the bezel portion of the display device in actual.

Further, since display devices such as an organic light emitting display device include a material that can be oxidized very easily by moisture or oxygen penetrating a display panel from outside, a method of effectively encapsulating the display panel has been studied for blocking moisture or oxygen penetrating therein from the outside.

BRIEF SUMMARY

Among display devices, some light emitting display devices capable of displaying images by emitting light outside of the display device have been introduced, the inventors of the present disclosure realized that one of drawbacks of such light emitting display devices is that light is trapped inside of the light emitting display devices and light extraction efficiency is in turn lowered.

Typical encapsulation methods for blocking moisture or oxygen penetrating a display panel or a display device from the outside require a complicated process. Also, one of drawbacks when such typical methods are used is that it is difficult to implement a thin bezel.

For example, one of the drawbacks of an edge seal method in which frits are located between an encapsulation substrate of glass and a substrate on which a pixel is disposed and in an edge of an active area of a display panel on which a pixel is located is that such resulted sealing is vulnerable to external shocks and this method is not suitable for encapsulating a large display panel.

In another example, one of the drawbacks of a thin film encapsulation method of forming multiple protective films by alternately disposing an organic encapsulation layer and an inorganic encapsulation layer on a light emitting element located over a substrate is that it takes a lot of time for a process of alternately disposing the organic encapsulation layer and the inorganic encapsulation layer.

In view of the foregoing, the inventors have developed display panels that can be formed by a simple process and allow a display device to have improved light extraction efficiency, and has excellent moisture permeability resistance and a thin bezel, and display devices including the display panel.

Problems or drawbacks to be solved of the present disclosure are not limited to the above description, and other problems or drawbacks to be solved of the present disclosure will become apparent to those skilled in the art from the following description.

In accordance with one embodiment of the present disclosure, a display panel is provided that is formed by a simple process, has excellent moisture permeability resistance and a thin bezel.

In some embodiments, the display panel includes an active area in which one or more sub-pixels are arranged and a non-active area surrounding at least one edge of the active area.

The display panel includes a substrate, a light emitting element located on the substrate, a protective layer located on the light emitting element and encapsulating the light emitting element, a graphene layer located on the protective layer and including a graphene oxide, a pressure sensitive adhesive layer located on the graphene layer and including a pressure sensitive adhesive, and a macromolecule film located on the pressure sensitive adhesive layer.

The light emitting element includes a first electrode located on the substrate, a light emitting layer located on the first electrode, and a second electrode located on the light emitting layer.

A nano-pattern is formed on an opposite surface of the macromolecule film from the pressure sensitive adhesive layer.

In accordance with one embodiment of the present disclosure, provided is a display device including the display panel.

The display device includes the display panel and a driving circuit for driving the display panel.

In accordance with embodiments of the present disclosure, since the display panel includes the graphene layer, the pressure sensitive adhesive layer and the macromolecule film, the display panel can have excellent moisture permeability resistance and a thin bezel.

Further, in accordance with embodiments of the present disclosure, since the display device includes the graphene layer, the pressure sensitive adhesive layer and the macromolecule film, the display device can have excellent moisture permeability resistance and a thin bezel.

Effects of the present disclosure are not limited to the above described effects, and other effects of the present disclosure will become apparent to those skilled in the art from the following description.

BRIEF DESCRIPTION OF THE SEVERAL VIEWS OF THE DRAWINGS

FIG. 11 illustrates that an encapsulation layer encapsulates a light emitting element in a display panel according to embodiments of the present disclosure.

DETAILED DESCRIPTION

Figure 1:
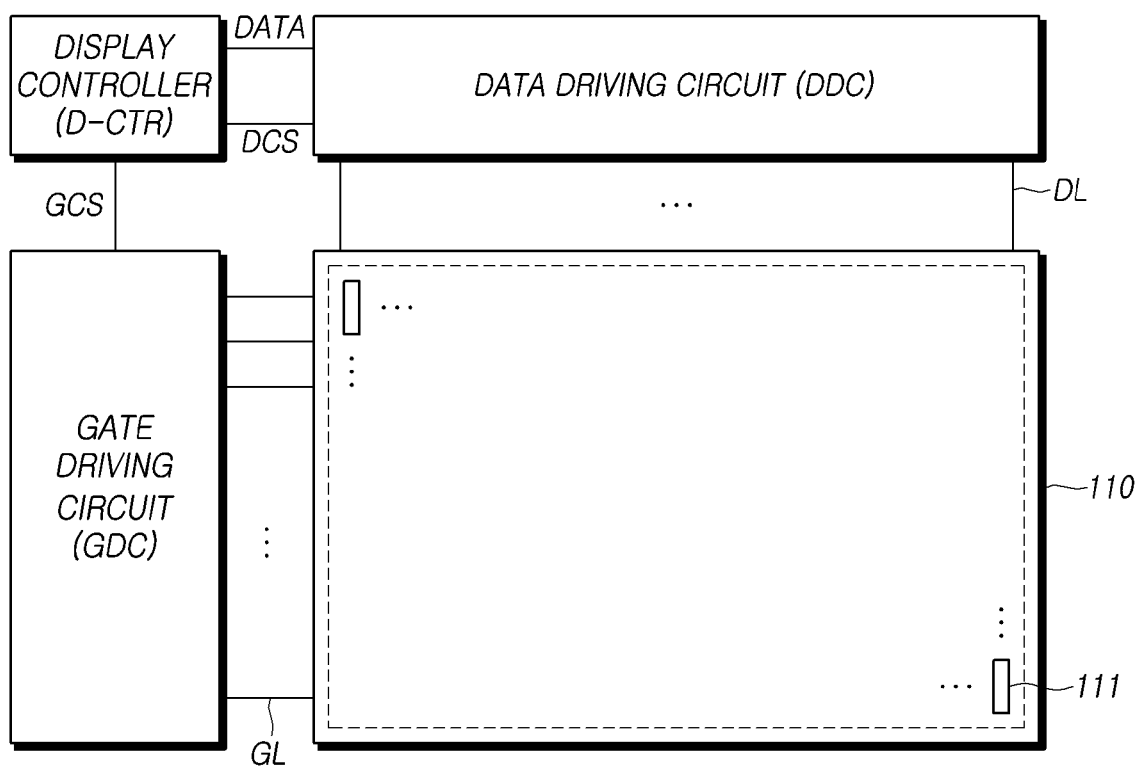
FIG. 1 illustrates a system configuration of a display device according to embodiments of the present disclosure.

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure.

In addition, the shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear. The terms such as "including", "having", "containing", and "comprising of" used herein are generally intended to allow other components to be added unless the terms are used with the term "only". Singular forms used herein are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Spatially relative terms, such as, "on", "over", "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as "directly", "only" are used.

Time relative terms, such as "after", "subsequent to", "next to", "before", or the like, used herein to describe a temporal relationship between events, operations, or the like are generally intended to include events, situations, cases, operations, or the like that do not occur consecutively unless the terms, such as "directly", "immediately", or the like, are used.

When the terms, such as "first", "second", or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

The elements or features of various embodiments of the present disclosure can be partially or entirely bonded to or combined with each other and can be interlocked and operated in technically various ways as can be fully understood by a person having ordinary skill in the art, and the various embodiments can be carried out independently of or in association with each other.

Hereinafter, in accordance with embodiments of the present disclosure, discussions are conducted on a display panel with excellent moisture permeability resistance and a thin bezel, and a display device including the display panel.

In some embodiments, as one component included in the display panel, a graphene oxide may include a negative graphene oxide flake, whose surfaces have negative charges, and a positive graphene oxide flake, whose surfaces have positive charges.

The graphene layer may be a layer on which a first graphene layer including the negative graphene oxide flake and a second graphene layer including the positive graphene oxide flake are alternately laminated.

The graphene layer may directly contact a protective layer.

The graphene layer may have a thickness of 0.5 μm to 4 μm.

The graphene layer may have a moisture permeability of $1 \times 10^{-4}$ g/m2 day or less.

The graphene layer may have a refractive index of 1.9 or more.

The graphene layer may further include a pressure sensitive adhesive identical to that included in a pressure sensitive adhesive layer.

The pressure sensitive adhesive layer may have a moisture permeability of $1 \times 10^{-4}$ g/m2 day to $1 \times 10^{1}$ g/m2 day.

The pressure sensitive adhesive layer may have a thickness of 50 μm to 400 μm.

The display panel may further include a touch buffer layer located on a macromolecule film and a plurality of touch electrodes located on the touch buffer layer. The touch buffer layer may directly contact the pressure sensitive adhesive layer in a non-active area.

The display panel may further include a conductive pad including one or more pad electrodes that may be provided with one or more distinct pins or terminals located in the non-active area. The touch buffer layer may directly contact the pressure sensitive adhesive layer in an area between the conductive pad and the active area.

Hereinafter, with reference to the accompanying drawings, various embodiments of the present disclosure will be described in detail.

FIG. 1 illustrates a system configuration of a display device 100 according to embodiments of the present disclosure.

Referring to FIG. 1, the display device 100 in accordance with embodiments of the present disclosure includes a display panel 110 in which a plurality of data lines DL and a plurality of gate lines GL are arranged, a plurality of sub-pixels 111 formed adjacent to the plurality of data lines DL and the plurality of gate lines GL, a data driving circuit DDC (or a data driver) for driving the plurality of data lines DL, a gate driving circuit GDC (or a gate driver) for driving the plurality of gate lines GL, a controller D-CTR controlling the data driving circuit DDC and the gate driving circuit GDC, and the like.

The controller D-CTR controls operations of the data driving circuit DDC and the gate driving circuit GDC by supplying respective control signals (DCS, GCS) to the data driving circuit DDC and the gate driving circuit GDC.

The controller D-CTR starts the scan of pixels according to timings processed in each frame, converts image data inputted from other devices or other image providing sources to be adapted to a data signal form used in the data driving circuit DDC and then outputs image data DATA resulted from the converting, and causes the data to be loaded into the pixels at a pre-configured time according to the scan.

The controller D-CTR may be implemented as a separate component from the data driving circuit DDC or may be integrated with data driving circuit DDC so the controller D-CTR can be implemented as an integrated circuit.

The data driving circuit DDC drives the plurality of data lines DL by providing data voltages corresponding to image data DATA received from the controller D-CTR to the data lines DL. Here, the data driving circuit DDC is sometimes referred to as a source driving circuit or a source driver.

The data driving circuit DDC may include at least one source driver integrated circuit SDIC to be implemented.

Each source driver integrated circuit SDIC may include a shift register, a latch circuit, a digital to analog converter DAC, an output buffer, and/or the like.

In some instances, each source driver integrated circuit SDIC may further include one or more analog to digital converters ADC.

The gate driving circuit GDC sequentially drives a plurality of gate lines GL by sequentially providing scan signals to the plurality of gate lines GL. Here, the gate driving circuit GDC is sometimes referred to as a scan driving circuit or a scan driver.

The gate driving circuit GDC may include at least one gate driver integrated circuit GDIC to be implemented.

Each gate driver integrated circuit GDIC may include a shift register, a level shifter, and/or the like.

Each gate driver integrated circuit GDIC may be connected to a bonding pad of the display panel 110 in a tape automated bonding (TAB) type or a chip on glass (COG) type, or be directly disposed on the display panel 110 as being implemented in a gate in panel (GIP) type. In some instances, the gate driver integrated circuit GDIC may be disposed to be integrated with the display panel 110. Further, each gate driver integrated circuit GDIC may be implemented in a chip on film (COF) type in which the gate driver integrated circuit GDIC is mounted on a film connected with the display panel 110.

According to the controlling of the controller D-CTR, the gate driving circuit GDC sequentially provides scan signals of an on-voltage or an off-voltage to the plurality of gate lines GL.

When a specific gate line is asserted by a scan signal from the gate driving circuit GDC, the data driving circuit DDC converts image data DATA received from the controller D-CTR into analog data voltages and provides the obtained analog data voltages to the plurality of data lines DL.

The data driving circuit DDC may be located on, but not limited to, only one side (e.g., an upper side or a lower side) of the display panel 110, or in some instances, be located on, but not limited to, two sides (e.g., the upper side and the lower side) of the display panel 110 according to driving schemes, panel design schemes, or the like.

The gate driving circuit GDC may be located on, but not limited to, only one side (e.g., a left side or a right side) of the panel 110, or in some instances, be located on, but not limited to, two sides (e.g., the left side and the right side) of the display panel 110 according to driving schemes, panel design schemes, or the like.

The display device 100 according to embodiments of the present disclosure may be one of various types of display devices, such as, a liquid crystal display device, an organic light emitting display device, a plasma display device, or the like.

In case the display device 100 according to embodiments of the present disclosure is an organic light emitting display device, each sub-pixel 111 arranged in the display panel 110 may include circuit components, such as an organic light emitting diode (OLED), which is a self-emissive element, a driving transistor for driving the organic light emitting diode OLED, and the like.

Types of circuit elements and the number of the circuit elements included in each subpixel 111 may be different depending on types of the panel (e.g., an LCD panel, an OLED panel, etc.), provided functions, design schemes/features, or the like.

Figure 2:
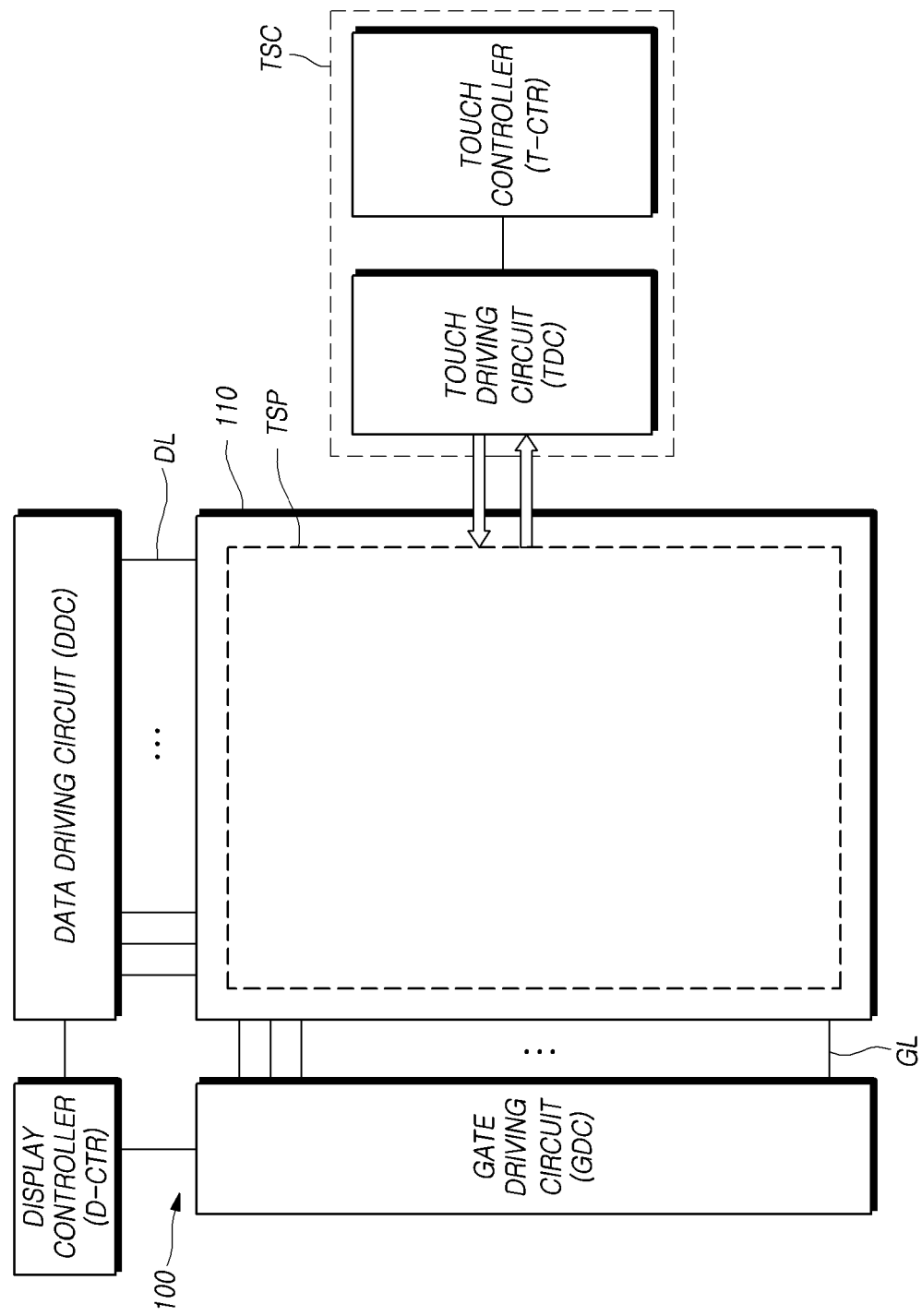
FIG. 2 illustrates a system configuration of a display device according to embodiments of the present disclosure.

FIG. 2 illustrates a system configuration of a display device according to embodiments of the present disclosure.

Referring to FIG. 2, the display device according to embodiments of the present disclosure may have a function of displaying images and a function of sensing a touch of a user.

The display device according to embodiments of the present disclosure may include a display panel 110 on which a plurality of data lines and a plurality of gate lines are arranged, a display driving circuit for driving the display panel 110, and the like.

The display driving circuit may include a data driving circuit DDC for driving a plurality of data lines, a gate driving circuit GDC for driving a plurality of gate lines, a display controller for controlling the data driving circuit DDC and the gate driving circuit GDC.

For touch sensing, a touch display device according to embodiments of the present disclosure may include a touch panel TSP, as a touch sensor, on which a plurality of touch electrodes is arranged, a touch sensing circuit TSC for processing the driving and sensing of the touch panel TSP, and the like.

The touch sensing circuit TSC supplies a driving signal to the touch panel TSP to drive the touch panel TSP, detects a sensing signal from the touch panel TSP, and based on this, senses the presence or absence of a touch and/or a touch location (e.g., a touch coordinate).

Such a touch sensing circuit TSC may be implemented by including a touch driving circuit TDC supplying a driving signal and receiving a sensing signal, and a touch controller T-CTR determining the presence or absence of a touch and/or a touch location (e.g., a touch coordinate), and the like.

The touch sensing circuit TSC may be implemented as one or more components (e.g., an integrated circuit), or implemented separately from the display driving circuit.

Further, all or at least one part of the touch sensing circuit TSC may be integrated with the display driving circuit or one or more circuits or components included in the display driving circuit, and thus, in turn, implemented as the integrated configuration. For example, the touch driving circuit TDC of the touch sensing circuit TSC may be implemented as an integrated circuit by being integrated with the data driving circuit DDC of the display driving circuit.

Meanwhile, the touch display device according to embodiments of the present disclosure can sense a touch based on a capacitance between a plurality of touch electrodes TE (touch sensors) or between one or more touch electrodes and a touch object such as a finger, a pen, or the like.

The touch display device according to embodiments of the present disclosure may be implemented in a capacitance-based touch sensing scheme, and also implemented in either a mutual-capacitive touch sensing scheme or in a self-capacitive touch sensing scheme.

Figure 3:
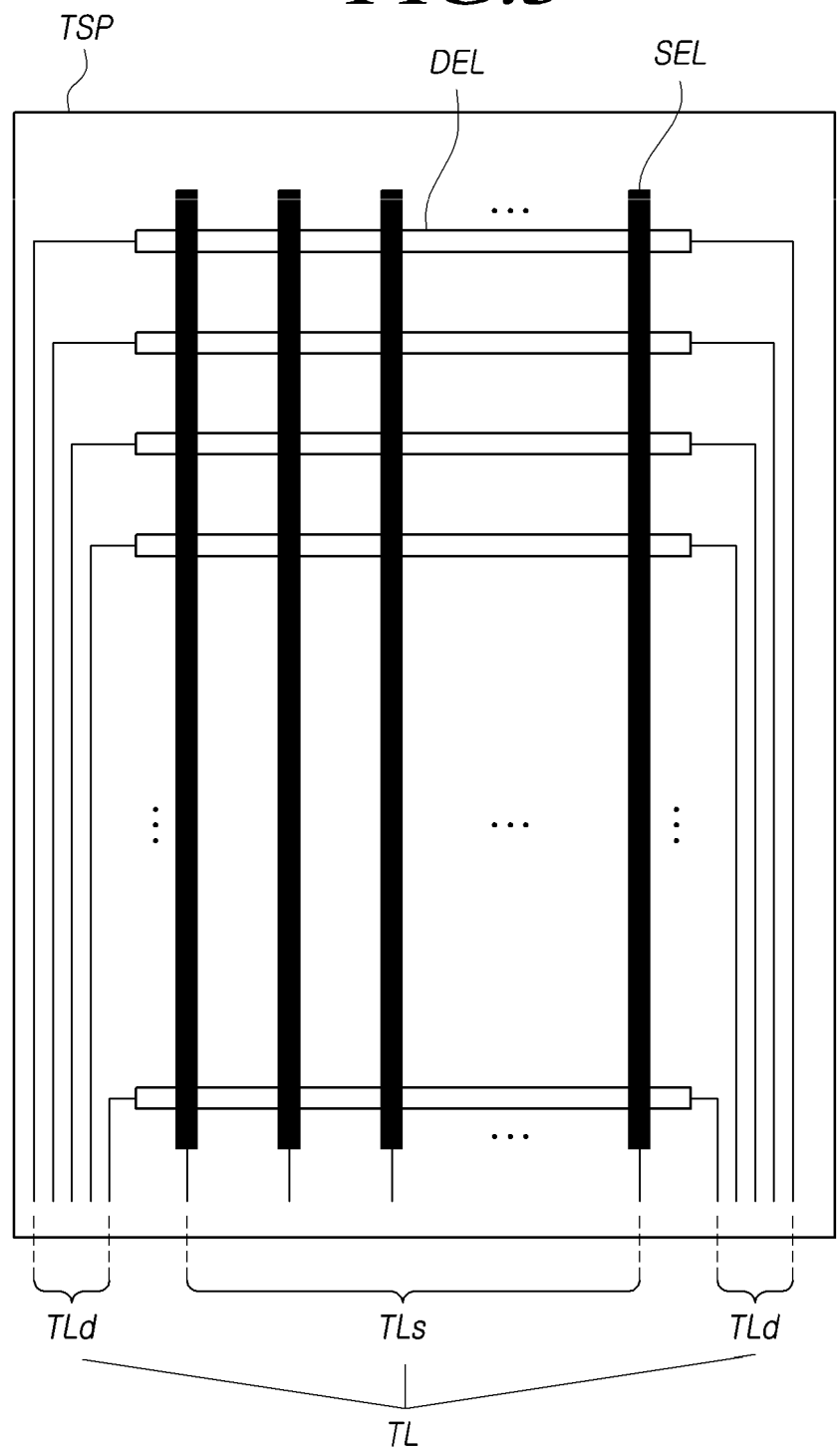
FIGS. 3 and 4 illustrate examples of a touch panel when a display device senses a touch in a mutual-capacitive touch sensing scheme according to embodiments of the present disclosure.
Figure 4:
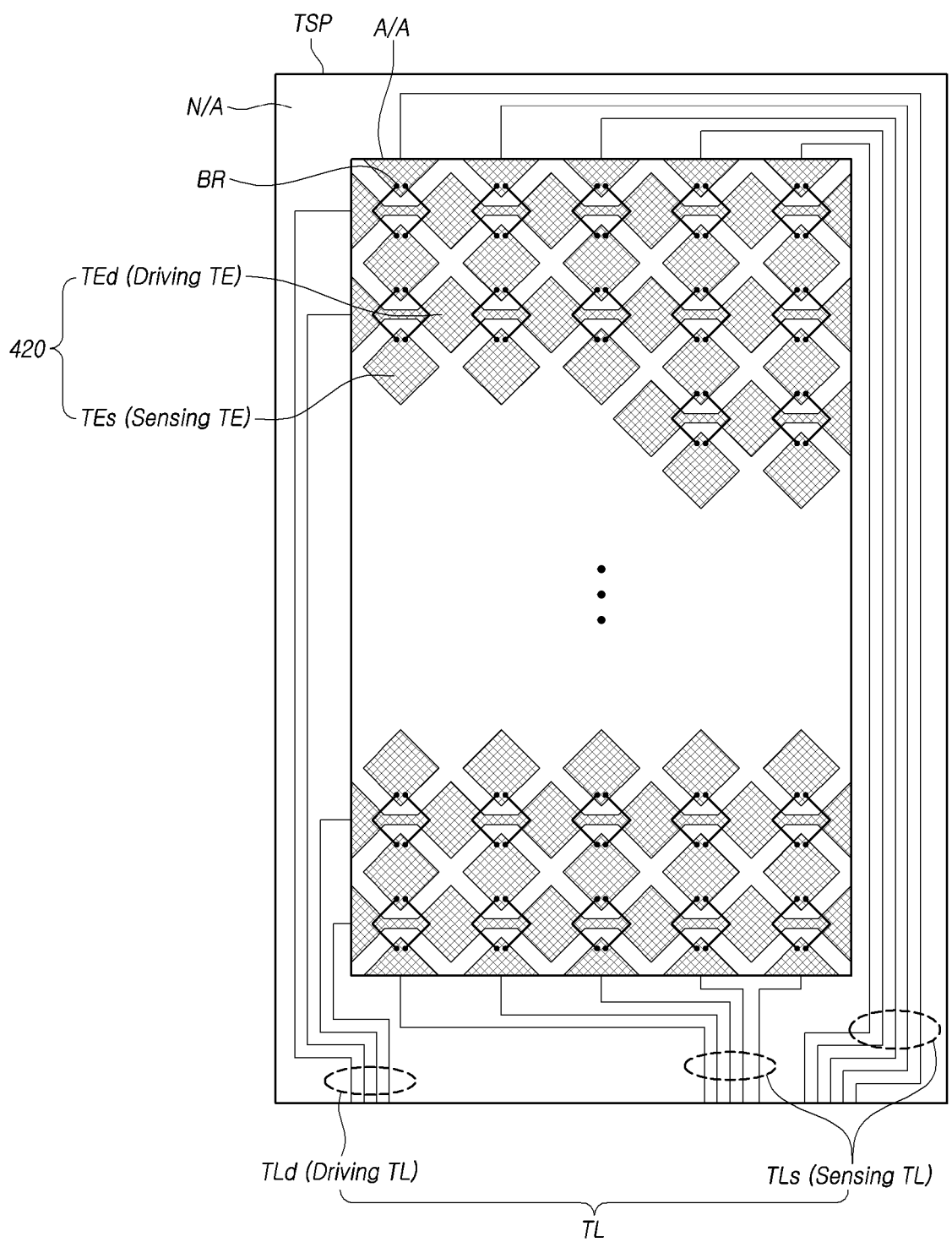
Figure 5:
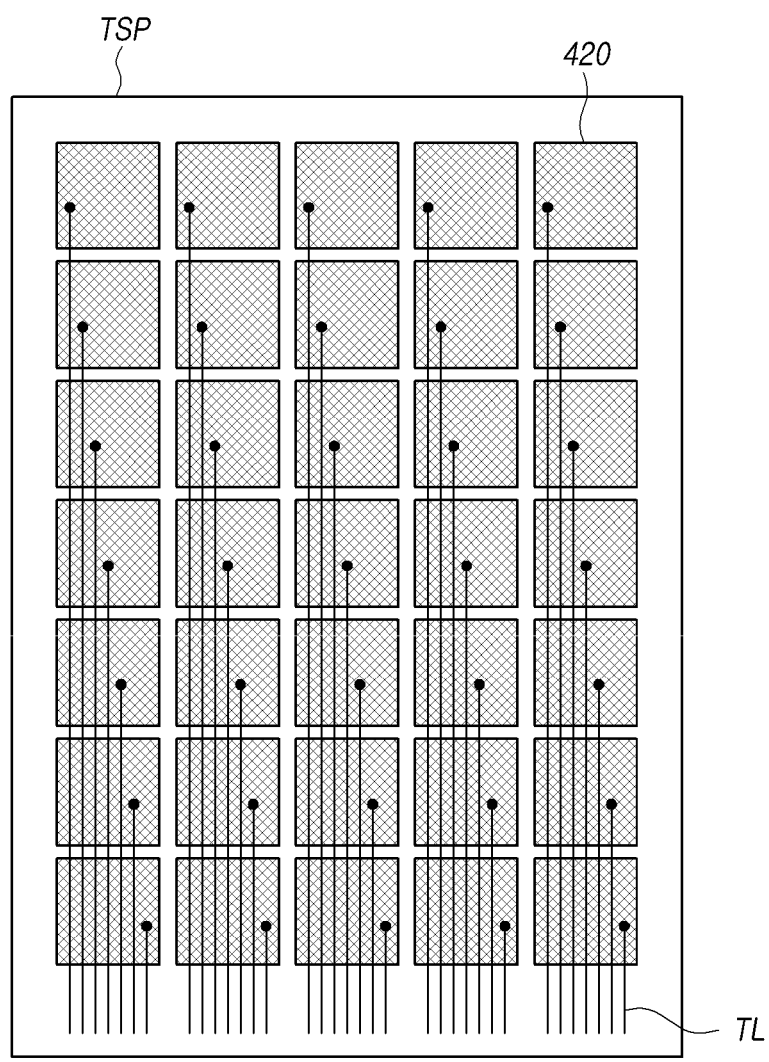
FIG. 5 illustrates an example of the touch panel TSP when the display device senses a touch in a self-capacitive touch sensing scheme according to embodiments of the present disclosure.

FIGS. 3 to 5 illustrate examples of a touch panel TSP included in the display device in accordance with embodiments of the present disclosure. FIGS. 3 and 4 illustrate examples of the touch panel TSP when the display device senses a touch in the mutual-capacitive touch sensing scheme according to embodiments of the present disclosure. FIG. 5 illustrates an example of the touch panel TSP when the display device senses a touch in the self-capacitive touch sensing scheme according to embodiments of the present disclosure.

Referring to FIG. 3, in the case of the mutual-capacitive touch sensing scheme, a plurality of touch electrodes arranged in the touch panel TSP may be classified into one or more driving touch electrodes (sometimes, referred to as driving electrodes, transmission electrodes, or driving lines, etc.) to which one or more driving signals are applied, and one or more sensing touch electrodes (sometimes, referred to as sensing electrodes, reception electrodes, or sensing lines, etc.) allowing a sensing signal to be sensed and forming a capacitance with the one or more driving touch electrodes.

Among the driving touch electrodes of the touch electrodes, two or more driving touch electrodes arranged in an identical row (or an identical column) may be electrically connected to one another by being integrated into one body (or being connected to one another with bridge connections such as patterned bridges), and in turn, form one driving touch electrode line DEL.

Referring to FIG. 3, among the sensing touch electrodes of the touch electrodes, one or more sensing touch electrodes arranged in an identical column (or an identical row) may be electrically connected to one another by being connected to one another with bridge connections such as patterned bridges (or being integrated into one body), and in turn, form one sensing touch electrode line SEL.

When the mutual-capacitive touch sensing scheme is used, the touch sensing circuit TSC supplies a driving signal to one or more driving touch electrode lines DEL, receives a sensing signal from one or more sensing touch electrode lines SEL, and based on the received sensing signal, detects the presence or absence of a touch and/or a touch coordinate according to changes in a capacitance (mutual-capacitance) between the driving touch electrode line DEL and the sensing touch electrode line SEL depending on whether a point of a finger, a pen, or a conductive object is present.

Referring to FIG. 3, for providing a driving signal and a sensing signal, each of a plurality of driving touch electrode lines DEL and each of a plurality of sensing touch electrode lines SEL may be electrically connected to a touch driving circuit TDC via one or more touch lines 230.

Specifically, for providing a driving signal, each of the plurality of driving touch electrode lines DEL may be electrically connected to the touch driving circuit TDC via one or more driving touch lines TLd. Further, for providing a sensing signal, each of the plurality of sensing touch electrode lines SEL may be electrically connected to the touch driving circuit TDC via one or more sensing touch lines TLs.

Further, a display device 100 to which the mutual-capacitive touch sensing scheme is applied may be configured as illustrated in FIG. 4.

Referring to FIG. 4, a plurality of touch electrodes 420 may be arranged in a touch panel TSP, and touch lines TL electrically connecting the plurality of touch electrodes 420 with a touch circuit may be arranged in the touch panel TSP.

Further, for electrically connecting the touch lines 230 with a touch driving circuit TDC, touch pads that the touch driving circuit TDC contacts may be located in the touch panel TSP.

The touch electrodes 420 and the touch lines TL may be located in an identical layer or in different respective layers.

Two or more touch electrodes forming one driving touch electrode line may be referred to as a driving touch electrode (driving TE). Two or more touch electrodes TE forming one sensing touch electrode line may be referred to as a sensing touch electrode (sensing TE).

At least one touch line TLd may be connected to each driving touch electrode line, and at least one touch line TLs may be connected to each sensing touch electrode line.

The at least one touch line TLd connected to each driving touch electrode line may be referred to as a driving touch line (driving TL). The at least one touch line TLs connected to each sensing touch electrode line may be referred to as a sensing touch line (sensing TL).

One touch pad may be connected to each touch line TL.

Referring to FIG. 4, a shape running along the edge of each of the plurality of touch electrodes 420 may be, for example, a rhombus shape, or in some embodiments, be a rectangle shape (which may include a square shape). However, embodiments of the present disclosure are not limited thereto. That is, the touch electrodes may have various shapes.

Further, a bridge configuration for a connection between two touch electrodes may include one patterned bridge BR or two or more patterned bridges BR.

The touch panel TSP according to embodiments of the present disclosure may be located inside of a display panel with an active area A/A and a non-active area N/A (referred to as an embedded type).

When the embedded type of touch panel TSP is used, the corresponding touch panel TSP and the corresponding display panel may be fabricated together through one panel fabricating process.

When the embedded type of touch panel TSP is used, the corresponding touch panel TSP may be a set of touch electrodes 420. Here, a plate on which the plurality of touch electrodes 420 is located may be a dedicated substrate, or a layer that is already present for another function (e.g., an encapsulation layer).

Referring to FIG. 5, when the self-capacitive touch sensing scheme is used, each touch electrode 420 arranged in the touch panel TSP has both a function of a driving touch electrode to which a driving signal is applied and a function of a sensing touch electrode from which a sensing signal is detected.

That is, a driving signal may be applied to each touch electrode 320, and a sensing signal can be received from the touch electrode 420 to which the driving signal is applied. Accordingly, when the self-capacitive touch sensing scheme is used, the driving electrode and the sensing electrode have the identical function.

When the self-capacitive touch sensing scheme is used, the touch sensing circuit TSC supplies a driving signal to one or more touch electrodes 420, receives a sensing signal from the one or more touch electrodes 420, and based on the received sensing signal, detects the presence or absence of a touch and/or a touch coordinate according to changes in a capacitance between the touch electrode 420 and a point of a finger, a pen, or a touch object.

Referring to FIG. 5, for providing a driving signal and a sensing signal, each of a plurality of touch electrodes 420 may be electrically connected to the touch driving circuit TDC via one or more touch lines 230.

Thus, the touch display device in accordance with embodiments of the present disclosure may sense a touch by the mutual-capacitive touch sensing scheme or the self-capacitive touch sensing scheme.

Meanwhile, in the touch display device in accordance with embodiments of the present disclosure, the touch panel TSP may be implemented in the embedded type in which the touch panel is fabricated together with the display panel 110 when the display panel 110 is fabricated and located inside of the display panel 110. That is, the touch panel TSP may be integrated into the display panel 110 in accordance with embodiments of the present disclosure.

Further, touch electrodes 420 and touch lines TL in accordance with embodiments of the present disclosure are electrodes and signal lines being present inside of the display panel 110.

Figure 6:
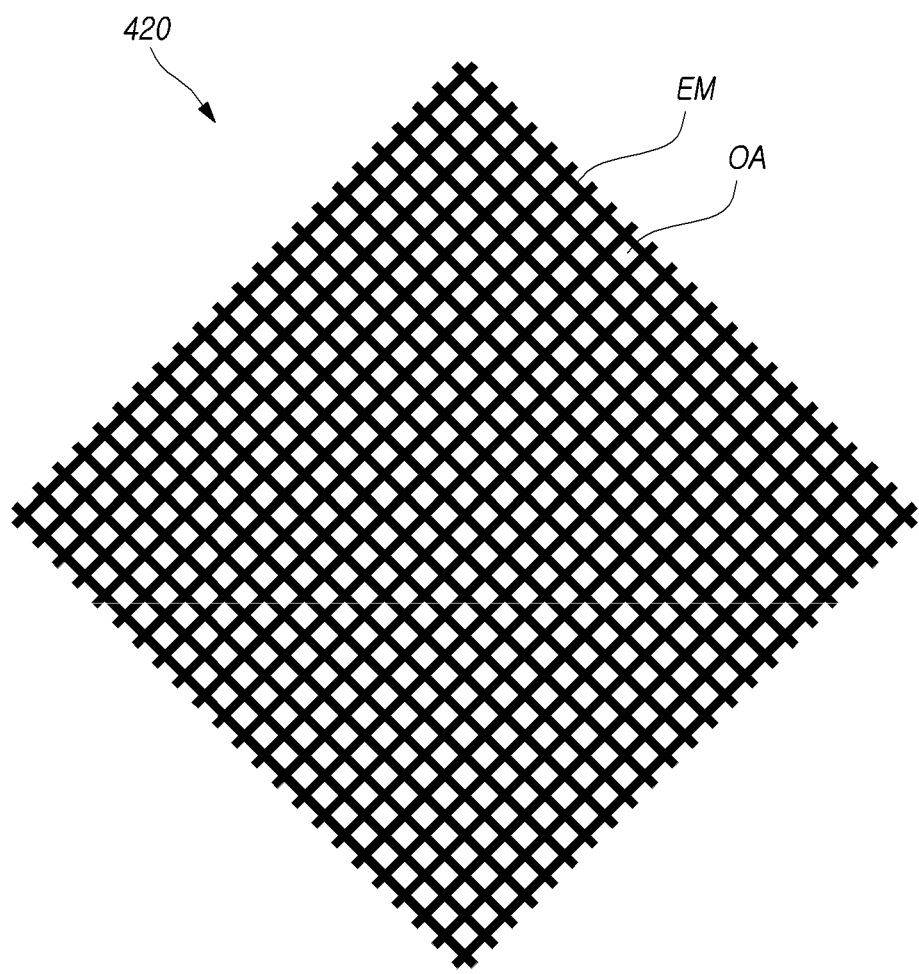
FIG. 6 illustrates that mesh-patterned touch electrodes are arranged in a touch panel in a flexible display device according to embodiments of the present disclosure.

FIG. 6 illustrates that touch electrodes with a mesh pattern are arranged in a touch panel TSP in a flexible display device according to embodiments of the present disclosure.

Referring to FIG. 6, in the flexible display device in accordance with embodiments of the present disclosure, each of a plurality of touch electrodes 420 arranged in the touch panel TSP may have a mesh pattern.

The mesh-patterned touch electrode 420 may be formed from an electrode metal EM patterned with a mesh.

Accordingly, a plurality of openings OA may be present in the touch electrode 420 patterned with the mesh.

Figure 7:
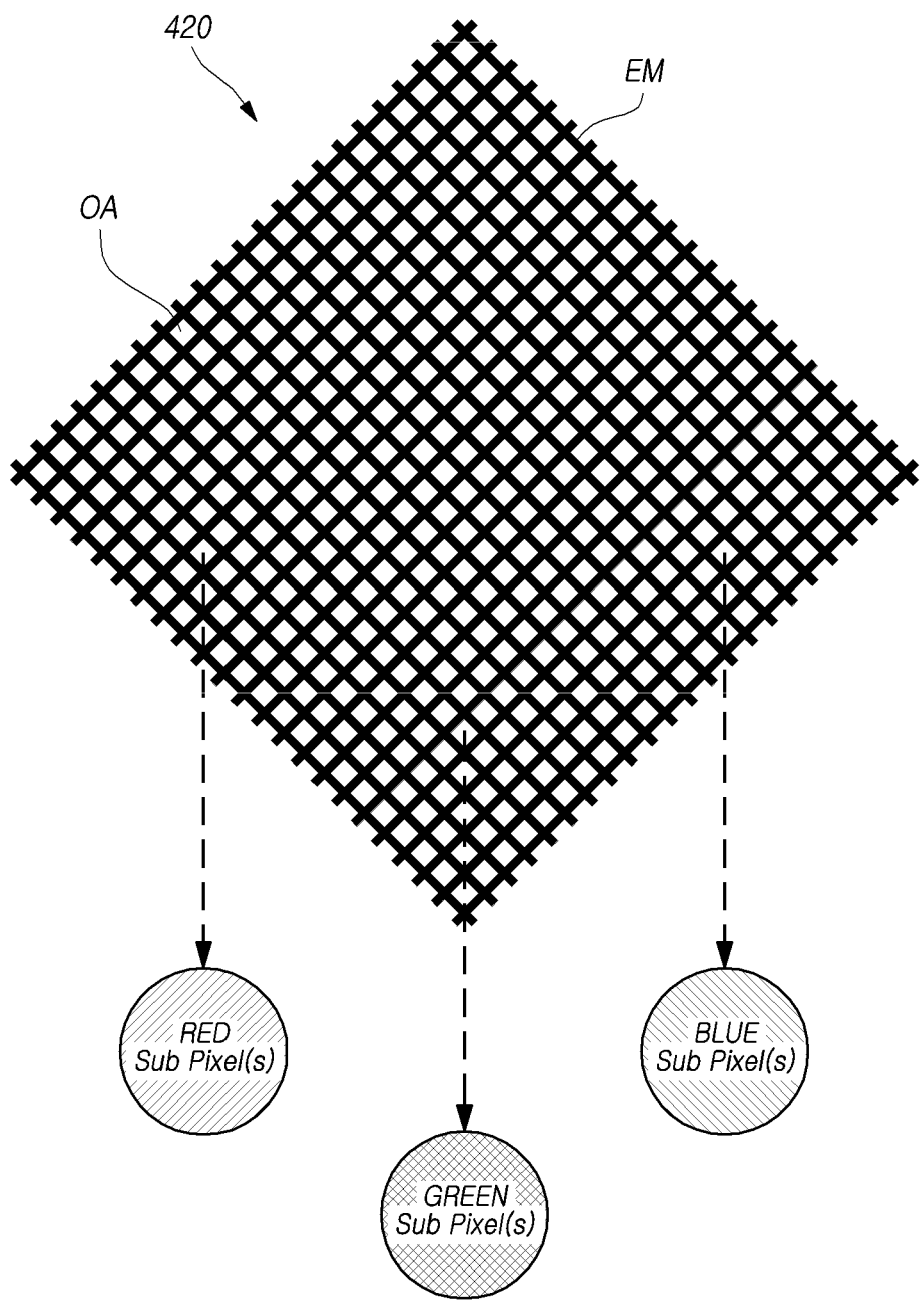
FIG. 7 illustrates a correspondence relationship between mesh-patterned touch electrodes and sub-pixels arranged in a touch panel in a flexible display device according to embodiments of the present disclosure.

FIG. 7 illustrates a correspondence relationship between mesh-patterned touch electrodes and sub-pixels arranged in the touch panel TSP in the flexible display device according to embodiments of the present disclosure.

Referring to FIG. 7, each of the openings OA being present inside of the touch electrode 420 formed from the electrode metal EM patterned with the mesh may correspond to a light emitting area of one or more sub-pixels.

For example, each of the plurality of openings OA being present inside of one touch electrode 420 may correspond to one or more of a red sub-pixel, a green sub-pixel, a blue sub-pixel light, and the like.

For another example, each of the plurality of openings OA being present inside of one touch electrode 420 may correspond to one or more of a red sub-pixel, a green sub-pixel, a blue sub-pixel light, a white sub-pixel, and the like.

As described above, when viewed in a plane, one or more light emitting area(s) of one or more sub-pixels being present in each of the openings OA of each touch electrode 420 can allow touch sensing to be performed and lead to touch panel DISP having a higher aperture ratio and greater luminance efficiency.

As described above, a shape running along the edge of one touch electrode 320 may be a rhombus shape, rectangular shape (including a square shape), or the like, and an opening formed in one touch electrode 320 may also have a rhombus shape, rectangular shape (including a square shape), or the like.

However, such shapes of the touch electrode 420 and the openings OA may be designed to be modified taking account of a shape of a sub-pixel, an arranged structure of sub-pixels, touch sensitivity, or the like.

Hereinafter, a sub-pixel structure (a sub-pixel circuit) in a display panel for displaying images using an organic light emitting diode OLED will be described in detail with reference to accompanying drawings.

Figure 8:
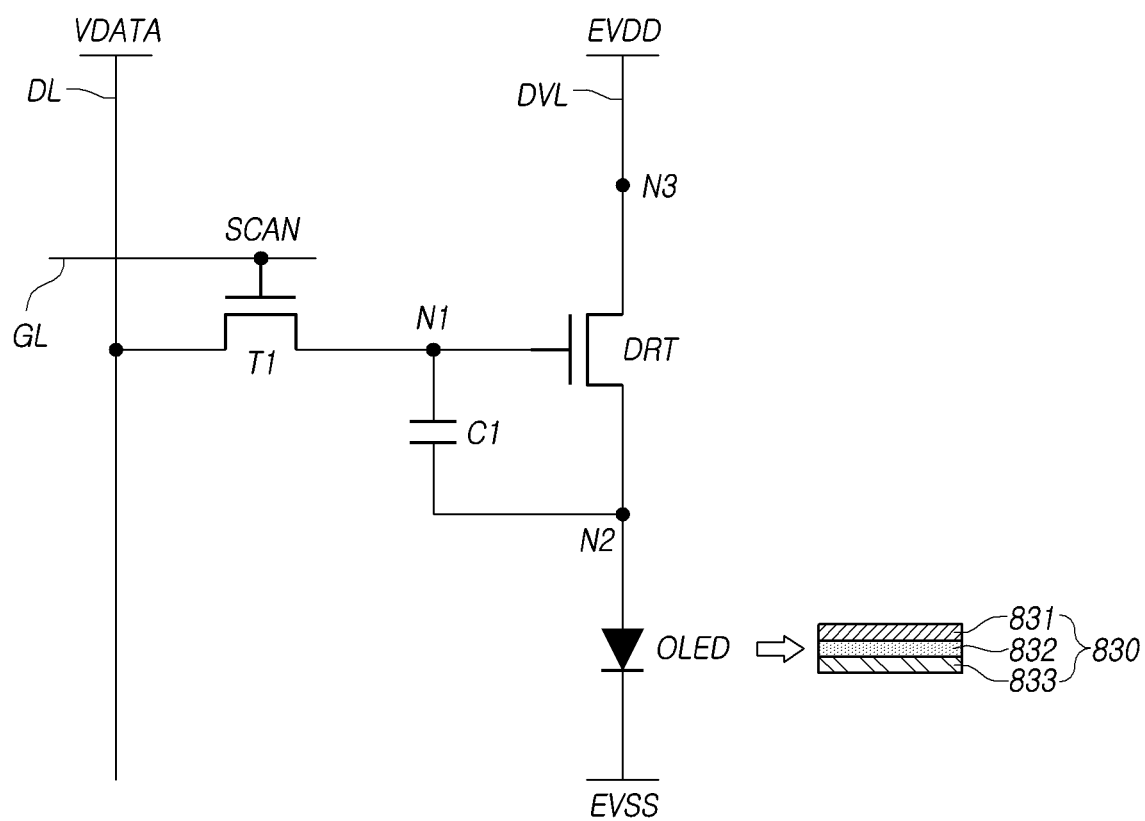
FIGS. 8 and 9 illustrate a sub-pixel circuit of a display panel according to embodiments of the present disclosure.
Figure 9:
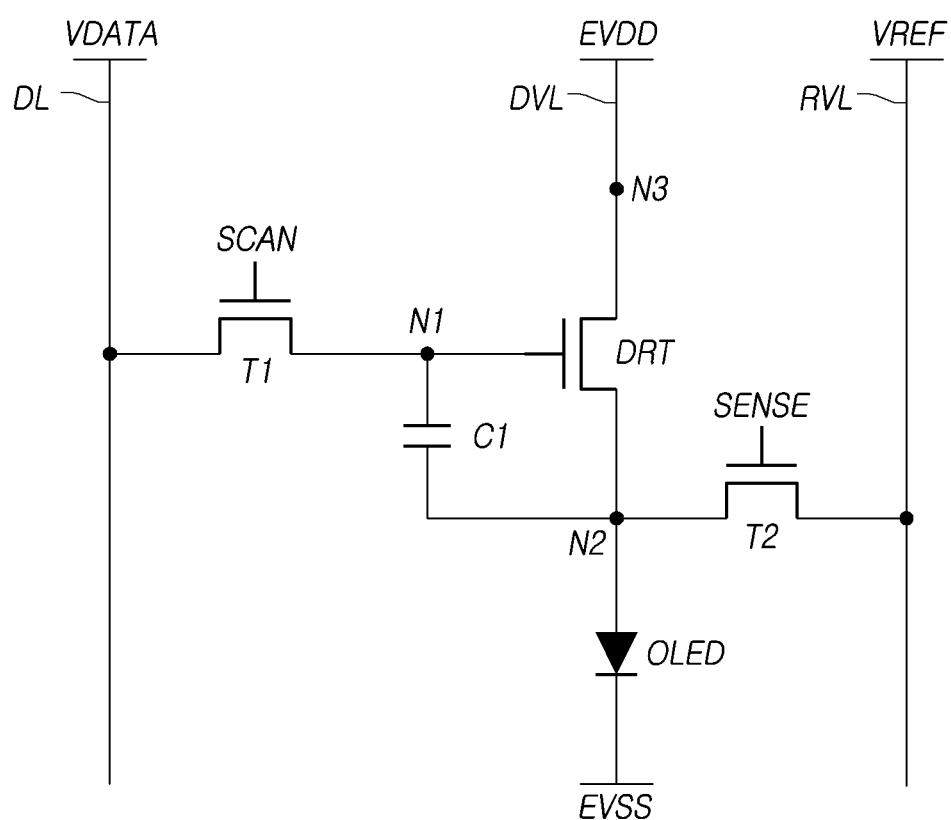

FIGS. 8 and 9 illustrate a sub-pixel circuit of a display panel according to embodiments of the present disclosure.

Referring to FIGS. 8 and 9, each subpixel 111 may include an organic light emitting diode OLED and a driving transistor DRT for driving the organic light emitting diode OLED as basic circuit components.

Referring to FIG. 8, each sub-pixel 111 may further include a first transistor T1 allowing a data voltage VDATA to be applied to a first node N1 corresponding to a gate node of the driving transistor DRT, and a storage capacitor C1 for remaining a data voltage VDATA corresponding to an image signal voltage or a voltage corresponding to this during one frame time.

The organic light emitting diode OLED may include a first electrode E1 (an anode electrode or a cathode electrode), a light emitting layer 832, a second electrode E2 (the cathode electrode or the anode electrode), and the like.

In one embodiment, a low-level voltage EVSS may be applied to the second electrode 833 of the organic light emitting diode OLED.

The driving transistor DRT causes the organic light emitting diode OLED to be driven by providing a driving current to the organic light emitting diode OLED.

The driving transistor DRT includes a first node N1, a second node N2 and a third node N3.

The first node N1 of the driving transistor DRT may be a node corresponding to the gate node thereof, and may be electrically connected to a source node or a drain node of the first transistor T1.

The second node N2 of the driving transistor DRT may be electrically connected to the first electrode 831 of the organic light emitting diode OLED and may be a source node or a drain node.

The third node N3 of the driving transistor DRT may be the drain node or the source node as a node to which a driving voltage EVDD is applied, and may be electrically connected to a driving voltage line DVL used to supply a driving voltage EVDD.

The driving transistor DRT and the first transistor T1 may be n-type transistors or p-type transistors.

The first transistor T1 may be electrically connected between a data line DL and the first node N1 of the driving transistor DRT and may be controlled by a scan signal SCAN that is provided through a gate line and applied to the gate node of the first transistor T1.

The first transistor T1 may be turned on by the scan signal SCAN and allow a data voltage VDATA supplied through the data line DL to be applied to the first node N1 of the driving transistor DRT.

The storage capacitor C1 may be electrically connected between the first node N1 and the second node N2 of the driving transistor DRT.

The storage capacitor C1 is an external capacitor intentionally designed to be located outside of the driving transistor DRT, not an internal storage, such as a parasitic capacitor (e.g., a Cgs, a Cgd) that presents between the first node N1 and the second node N2 of the driving transistor DRT.

Referring to FIG. 9, each sub-pixel 111 arranged in the display panel in accordance with embodiments of the present disclosure may further include a second transistor T2 in addition to the organic light emitting diode OLED, the driving transistor DRT, the first transistor T1, and the storage capacitor C1.

The second transistor T2 may be electrically connected between the second node N2 of the driving transistor DRT and a reference voltage line RVL used to supply a reference voltage VREF, and may be controlled by a sensing signal SENSE applied to the gate node of the second transistor T2, which is a type of the scan signal.

The additional inclusion of the second transistor T2 leads a voltage of the second node N2 of the driving transistor DRT included in the sub-pixel 111 to be controlled effectively.

The second transistor T2 may be turned on by the sensing signal SENSE and allow a reference voltage VREF provided through the reference voltage line RVL to be applied to the second node N2 of the driving transistor DRT.

The sub-pixel structure illustrated in FIG. 9 is advantageous in accurately initializing a voltage in the second node N2 of the driving transistor DRT and in sensing an intrinsic characteristic value (e.g., threshold voltage or mobility) of the driving transistor DRT and an intrinsic characteristic value (e.g., threshold voltage) of the organic light emitting diode OLED.

Meanwhile, the scan signal SCAN and the sensing signal SENSE may be separate gate signals. In this case, the scan signal SCAN and the sensing signal SENSE respectively may be applied to the gate node of the first transistor T1 and the gate node of the second transistor T2 through different respective gate lines.

In some instances, the scan signal SCAN and the sensing signal SENSE may be the same gate signal. In this case, the scan signal SCAN and the sensing signal SENSE may be commonly applied to the gate node of the first transistor T1 and the gate node of the second transistor T2 through the same gate line.

Figure 10:
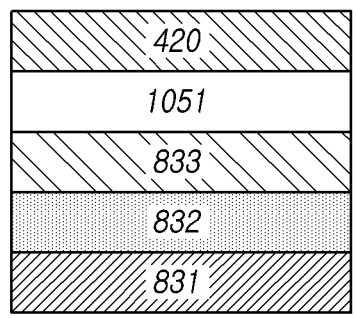
FIG. 10 illustrates the location of a touch electrode in a display panel according to embodiments of the present disclosure.

FIG. 10 illustrates the location of a touch electrode in a display panel according to embodiments of the present disclosure.

Referring to FIG. 10, a touch electrode 420 in the display panel in accordance with embodiments of the present disclosure may be disposed on an encapsulation layer 1051 located on an organic light emitting diode OLED.

Here, the encapsulation layer 1051 is a layer for protecting an organic material in included a light emitting layer 832 from moisture, air, or the like, and may be located on a second electrode 833 of the organic light emitting diode OLED which may be a cathode electrode thereof.

The encapsulation layer 1051 may include a graphene layer including a graphene oxide, a pressure sensitive adhesive layer located on the graphene layer and including a pressure sensitive adhesive, and a macromolecule film located on the pressure sensitive adhesive layer. As the display panel in accordance with embodiments of the present disclosure is provided with the encapsulation layer including the graphene layer, the pressure sensitive adhesive layer and the macromolecule film, the display panel can realize a thin bezel because a dam DAM structure in the non-active area is not required.

As illustrated in FIG. 10, a structure in which the touch electrode 420 is formed on the encapsulation layer 1051 is sometimes referred to as a touch on encapsulation layer (TOE).

Meanwhile, a color filter layer may be further present between the encapsulation layer 1051 and the touch electrode 420, or on the touch electrode 420.

Thus, a capacitance Cp may be formed due to a potential difference between the second electrode 833 and the touch electrode 420.

A capacitance needed for sensing a touch is a capacitance between the touch electrodes 420 or a capacitance between the touch electrode 420 and a touch object (e.g., a finger, a pen, or the like).

A planarization layer (not shown) may be located on the touch electrode 420. The planarization layer can planarize unevenness formed by the touch electrode 420. A touch substrate, such as a glass substrate, a plastic substrate, or the like, may be located on the planarization layer.

FIG. 11 illustrates that an encapsulation layer encapsulates a light emitting element in a display panel according to embodiments of the present disclosure.

Referring to FIG. 11, a light emitting element 830 is located on a substrate 1140. The light emitting element 830 may be, for example, an organic light emitting diode including a first electrode, a light emitting layer and a second electrode, which is a self-emissive element.

A protective layer 1150 may be located on the light emitting element 830. The protective layer 1150 may include, for example, an inorganic insulating material; however, embodiments of the present disclosure are not limited thereto.

An encapsulation layer (1160, 1170, 1180) may be located on the protective layer 1150 and can encapsulate the light emitting element 830. The encapsulation layer includes a graphene layer 1160, a pressure sensitive adhesive layer 1170 and a macromolecule film 1180.

The graphene layer 1160 is located on the protective layer 1150, and includes a graphene oxide. For example, the graphene layer 1160 may include a graphene oxide fabricated by Hummer's method.

As the encapsulation layer 1051 in accordance with embodiments of the present disclosure includes the graphene layer 1160 including the graphene oxide, the encapsulation layer can have excellent moisture permeability resistance and be fabricated by a simple process.

The pressure sensitive adhesive layer 1170 is located on the graphene layer 1160 and includes a pressure sensitive adhesive. A type of the pressure sensitive adhesive included in the pressure sensitive adhesive layer 1170 is not limited to a specific type, and may be selected taking account of mechanical properties such as optical performance, adhesive strength, elastic modulus, and the like.

As the pressure sensitive adhesive layer 1170 is located on the graphene layer 1160, when the encapsulation layer is formed by a lamination process, the graphene layer 1160 can be planarized by the pressure sensitive adhesive layer 1170, and adhesive strength between the graphene layer 1160 and the protective layer 1150 may be improved by defects such as pinholes of the graphene layer 1160.

The macromolecule film 1180 is located on the pressure sensitive adhesive layer 1170. The macromolecule film 1180 has a first side and a second side opposite of the first side. The first side of the macromolecule film 1180 is adjacent to the pressure sensitive adhesive layer 1170. In some embodiments, the first side of the macromolecule film 1180 faces and contacts the pressure sensitive adhesive layer 1170. The second side which is an opposite surface of the macromolecule film 1180 from the pressure sensitive adhesive layer 1170 has a nano-pattern formed thereon. As illustrated in FIG. 11, the surface of the macromolecule film 1180 may have an unevenness shape due to the nano-pattern. In some embodiments, nano-pattern is a pattern that broadly refers to any patterns that have a dimension in nanometers.

When the nano-pattern is formed on the surface of the macromolecule film 1180, light being totally reflected in an interface between the macromolecule film 1180 and the outside of the macromolecule film may be reduced. Accordingly, as the nano-pattern is formed on the surface of the macromolecule film 1180, light being trapped inside of a display panel or a display device may be reduced, and in turn, light extraction efficiency may be improved.

The nano-pattern may have a plurality of members that forms a pattern shape. In some embodiments, the size and shape of the members of the nano-pattern are not limited to a specific size and shape as long as it is a size or shape capable of improving the light extraction efficiency. For example, a size and a shape of the nano-pattern may be determined taking account of a wavelength band of light emitted from the light emitting element 830, or the like. In some embodiments, the intervals or distances between adjacent members of the patterns does not have to be constant or space apart evenly. Various intervals and distances that improves the light extraction efficiency may be employed. In some embodiments, each shape and size of the member of the patterns may differ from other members within the pattern. For example, the size and shape of the individual members of the patterns may have different sizes and shapes that facilitates light extraction efficiency.

When a nano-pattern is formed on one surface (e.g., a second side) of the macromolecule film 1180, the surface of the macromolecule film 1180 with the nano-pattern may have hydrophobicity. Accordingly, the macromolecule film 1180 may have excellent moisture permeability resistance and in turn, moisture permeability resistance of the encapsulation layer 1051 may be improved.

A type of the macromolecule film 1180 is not limited to a specific type, and may be selected taking account of moisture permeability resistance and mechanical properties. For example, the macromolecule film 1180 may be a polyvinylidene fluoride (PVDF) film; however, embodiments of the present disclosure are not limited thereto.

A graphene oxide included in the graphene layer 1160 may include a negative graphene oxide flake, whose surfaces have negative charges, and a positive graphene oxide flake, whose surfaces have positive charges.

In one embodiment, after an encapsulation film including a graphene layer located on a liner film, a pressure sensitive adhesive layer and a macromolecule film are fabricated, by removing the liner film, an encapsulation layer of a display panel may be formed by a method of transferring the graphene layer, the pressure sensitive adhesive layer and the macromolecule film on a light emitting element 830 through a lamination process, The forming of the graphene layer on the liner film may be performed such that the graphene layer including a negative graphene oxide flake and a positive graphene oxide flake is fabricated by repeatedly alternately laminating the negative graphene oxide flake and the positive graphene oxide flake.

Figure 12:
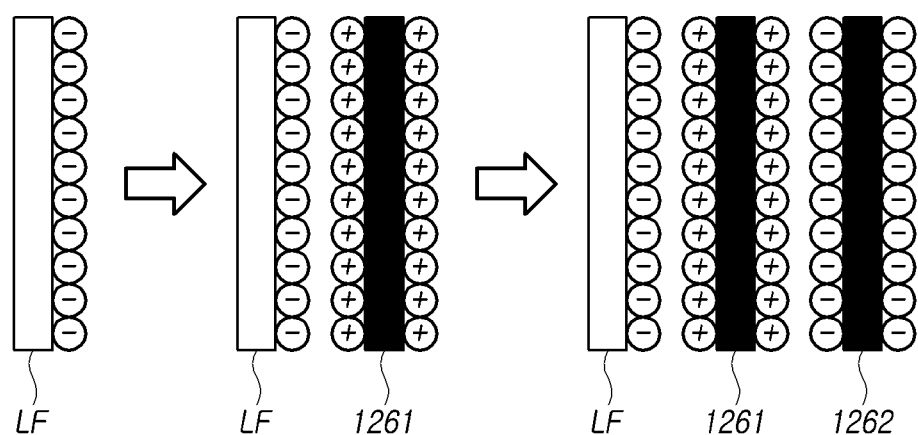
FIG. 12 illustrates a graphene layer of a display panel according to embodiments of the present disclosure.

FIG. 12 illustrates the graphene layer of the display panel according to embodiments of the present disclosure.

The liner film LF is a film used to form the graphene layer, and removed prior to encapsulating the light emitting element. The liner film LF may be surface-treated in order to induce electric charges, leading to graphene oxide flakes being better laminated.

For example, the surface treatment of the liner film LF may lead one surface of the liner film LF to have negative charges.

After the surface treatment is performed in order for the surface of the liner film LF to have negative charges, a positive graphene oxide flake 1261, whose surfaces have positive charges, may be laminated on the liner film LF. Since the surface of the liner film LF has negative charges and the surfaces of the graphene oxide flake 126 laminated on the liner film LF have positive charges, thus, bonding strength between the liner film LF and a layer including the positive graphene oxide flake is improved, in turn, leading to the layer including the positive graphene oxide flake 1261 being easily formed.

After the layer including the positive graphene oxide flake 1261 is formed, a layer including a negative graphene oxide flake 1262 may be formed. As the surfaces of the layer including the positive graphene oxide flake 1261 have positive charges, when the negative graphene oxide flake 1262, whose surfaces have negative charges, is formed on the positive graphene oxide flake 1261, bonding strength between layers is improved, in turn, leading to the layer including the negative graphene oxide flake 1262 being easily formed.

With reference to FIG. 12, discussions have been conducted on the method of performing treatment enabling the surface of the liner film LF to have negative charges and then laminating a positive graphene oxide flake 1261; however, embodiments of the present disclosure are not limited thereto. For example, it is possible to form the graphene layer using another method of performing treatment enabling the surface of the liner film LF to have positive charges, and then, laminating a negative graphene oxide flake.

When the graphene layer 1160 includes the positive graphene oxide flake 1261 and the negative graphene oxide flake 1262, the flakes, the flakes can be more closely adhered to each other, and in turn, defects such as pinholes, etc., of the graphene layer 1160 are supplemented, leading to the graphene layer 1160 having better moisture permeability resistance.

The graphene layer 1160 may have, for example, moisture permeability according to ASTM D3985 of $1 \times 10^{-4}$ g/m$^2$·day or less. Since the moisture permeability resistance of the graphene layer 1160 is better as the moisture permeability is lower, a lower limit of the moisture permeability of the graphene layer 1160 is not limited to a specific value, for example, may be $1 \times 10^{-7}$ g/m2·day or more. As the graphene layer 1160 has the moisture permeability falling within this range, the associated encapsulation layer 1051 can have excellent moisture permeability resistance.

The graphene layer 1160 may have a high refractive index. For example, the refractive index of the graphene layer 1160 may be 1.9 or more, or 1.93 or more. An upper limit of the refractive index of the graphene layer 1160 may be, for example, 2.1 or less, or 2.0 or less. When the graphene layer 1160 has the high refractive index as described above, internal light extraction efficiency may be improved.

Figure 13:
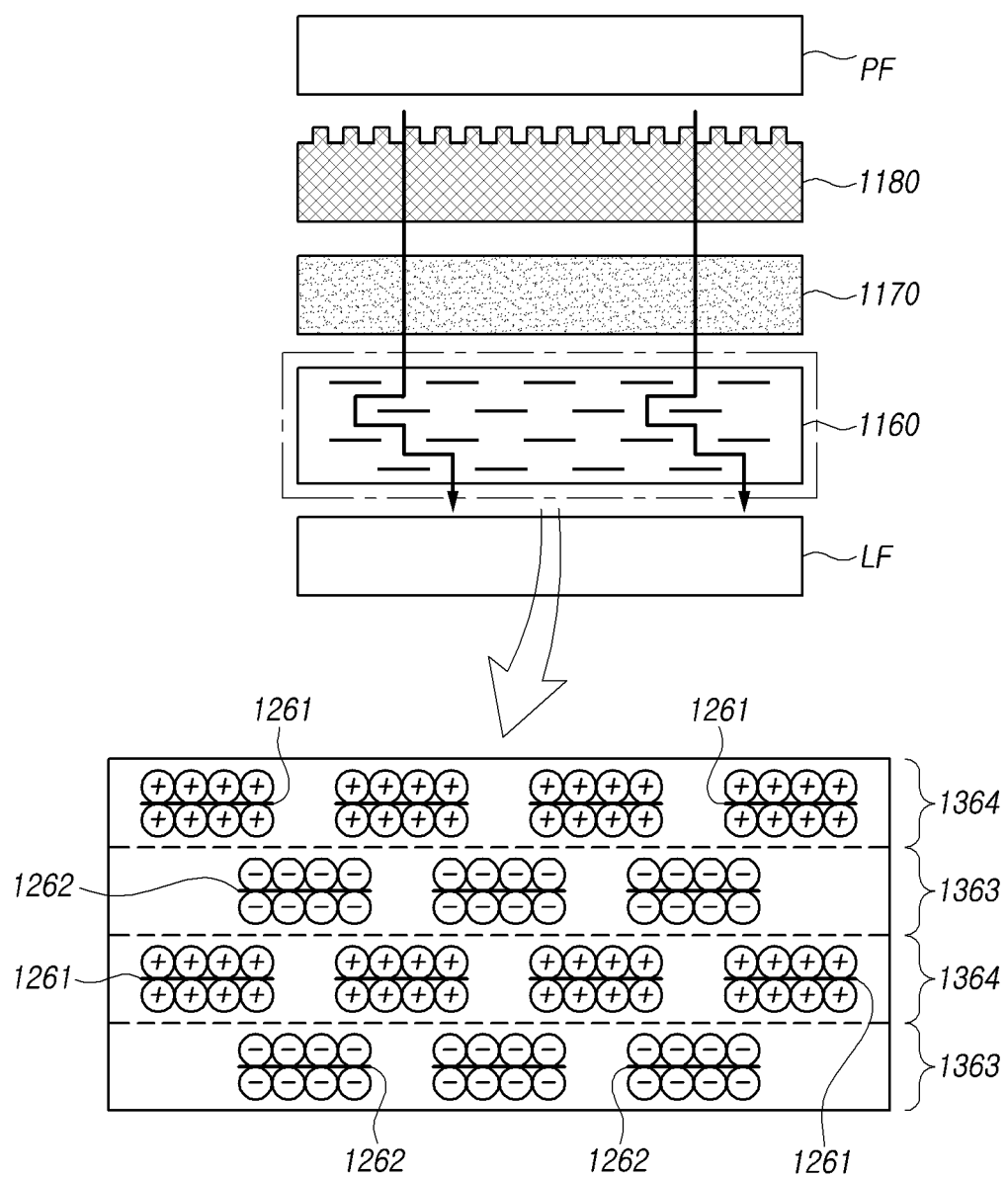
FIG. 13 illustrates an encapsulation film and a graphene layer applied to a display panel according to embodiments of the present disclosure.

FIG. 13 illustrates an encapsulation film that can be used to transfer an encapsulation layer on a light emitting element, and a graphene layer of the display panel according to embodiments of the present disclosure.

Referring to FIG. 13, the encapsulation film may include a liner film LF, a graphene layer 1160, a pressure sensitive adhesive layer 1170, a macromolecule film 1180 and a protective film PF.

The liner film LF and the protective film PF are films being removed during an encapsulation process using the encapsulation film, and serves to protect the graphene layer 1160, the pressure sensitive adhesive layer 1170 and the macromolecule film 1180 during the encapsulation process.

The graphene layer 1160 may be a layer in which a first graphene layer 1363 including negative graphene oxide flakes 1262 and a second graphene layer 1364 including positive graphene oxide flakes 1263 are alternately laminated.

When the graphene oxide flakes 1261 and 1262 are alternately laminated, the graphene layer can include the first graphene layer 1363 and the second graphene layer 1364.

Herein, the first graphene layer 1363 may be referred to as a layer resulted from a laminating process of negative graphene oxide flakes 1262, and the second graphene layer 1364 may be referred to as a layer resulted from a laminating process of positive graphene oxide flakes 1261.

Since the first graphene layer 1363 and the second graphene layer 1364 are layers formed from densely stacked graphene flakes 1262 and 1262, thus, a boundary between the first graphene layer 1363 and the second graphene layer 1364 may not be clear.

The graphene layer 1160 may be formed by a layer by layer assembly scheme in which the first graphene layer 1363 and the second graphene layer are alternately laminated; thus, in turn, a structure of the graphene layer 1160 may be obtained to be associated with that scheme.

Since the first graphene layer 1363 and the second graphene layer 1364 are alternately repeatedly laminated, paths between graphene flakes included in each graphene layer may be block due to an adjacent layer. Accordingly, as illustrated in FIG. 13, while passing through the graphene layer 1160, the permeating of moisture through the graphene layer 1160 may be significantly delayed. Further, due to electric charges of graphene oxide flakes included in the first graphene layer 1363 and the second graphene layer 1364, attractive force generated between the first graphene layer 1363 and the second graphene layer 1364 leads to interlayer adhesion being excellent, thus, the permeating of moisture through the graphene layer 1160 may be more delayed.

As described above, since the graphene layer 1160 in accordance with embodiments of the present disclosure has a feature capable of delaying the permeating of moisture, the graphene layer 1160 can have excellent moisture permeability resistance even with a very thin thickness. A thickness of the graphene layer 1160 may be, for example, 0.5 μm to 4 μm. In case the thickness of the graphene layer 1160 falls within this range, an associated display panel can have excellent moisture permeability resistance and the pressure sensitive adhesive layer 1170 can improve adhesive strength between the graphene layer 1160 and the protective film 1150.

The pressure sensitive adhesive layer 1170 is located on the graphene layer 1160 and includes a pressure sensitive adhesive. A type of the pressure sensitive adhesive included in the pressure sensitive adhesive layer 1170 is not limited to a specific type, and may be selected taking account of optical properties, adhesive strength, moisture permeability resistance.

The pressure sensitive adhesive layer 1170 may have, for example, moisture permeability according to ASTM D3985 of $1 \times 10^{-4}$ g/m²·day to $1 \times 10^{-1}$ g/m²·day. As the pressure sensitive adhesive layer 1170 has the moisture permeability falling within this range, the associated encapsulation layer 1051 can have excellent moisture permeability resistance.

The pressure sensitive adhesive layer 1170 can serve to bond not only the graphene layer 1160 and the macromolecule film 1180 but the graphene layer 1160 and the protective layer 1150. For example, the light emitting element 830 may be encapsulated by a lamination scheme in which pressure is put on the encapsulation film after the liner film LF of the encapsulation film has been removed and the encapsulation film has been located on the protective layer 1150. In case pressure is put on the encapsulation film, at least a part of pressure sensitive adhesive of the pressure sensitive adhesive layer located on the graphene layer 1160 can move into the graphene layer 1160, and in turn, a part thereof can reach the protective layer 1150; therefore, adhesive strength between the graphene layer 1160 and the protective layer 1150 can be improved.

In case the light emitting element 830 is encapsulated by the lamination process of the encapsulation film as described above, a pressure sensitive adhesive identical to that included in the pressure sensitive adhesive layer 1170, for example, an identical type of adhesive macromolecule, may be included in the graphene layer 1160 of the display panel.

The pressure sensitive adhesive layer 1170 may planarize an upper portion of the graphene layer 1160. Even though the protective layer 1150 may be, for example, formed by a vapor deposition process, since the light emitting element 830 weak to high temperature is located under the protective layer 1150, in a protective layer deposition process step, the deposition process of the protective layer 1150 may be performed at a certain low temperature. However, surface characteristics of the protective layer 1150 may decrease when the protective layer 1150 is disposed at the low temperature. When the graphene layer 1160 formed on the protective layer 1150 is formed by the above fabricating method, it is not easy for the graphene layer 1160 to planarize the protective layer 1150 too.

Thus, the pressure sensitive adhesive layer 1170 may have a thickness sufficient to planarize the graphene layer 1160. For example, the pressure sensitive adhesive layer 1170 may have a thickness of about 100 times a thickness of the graphene layer 1160, and may be 50 μm to 400 μm. When the pressure sensitive adhesive layer 1170 has a thickness falling within these ranges, the graphene layer 1160 may be planarized without introducing a separate organic layer.

Accordingly, when a separate organic layer is introduced on the protective layer 1150, since it is possible to omit a dam structure to be introduced in a non-active area N/A to prevent the organic layer from flowing, thus, the display panel can have a thin bezel.

In the display panel in accordance with embodiments of the present disclosure, since an upper portion of the graphene layer 1160 can be planarized even when a separate organic layer is not introduced on the protective layer 1150, without the separate organic layer to be introduced between the protective layer 1150 and the graphene layer 1160, the graphene layer 1160 can be directly located on the protective layer 1150, and directly contact the protective layer 1150.

Figure 14:
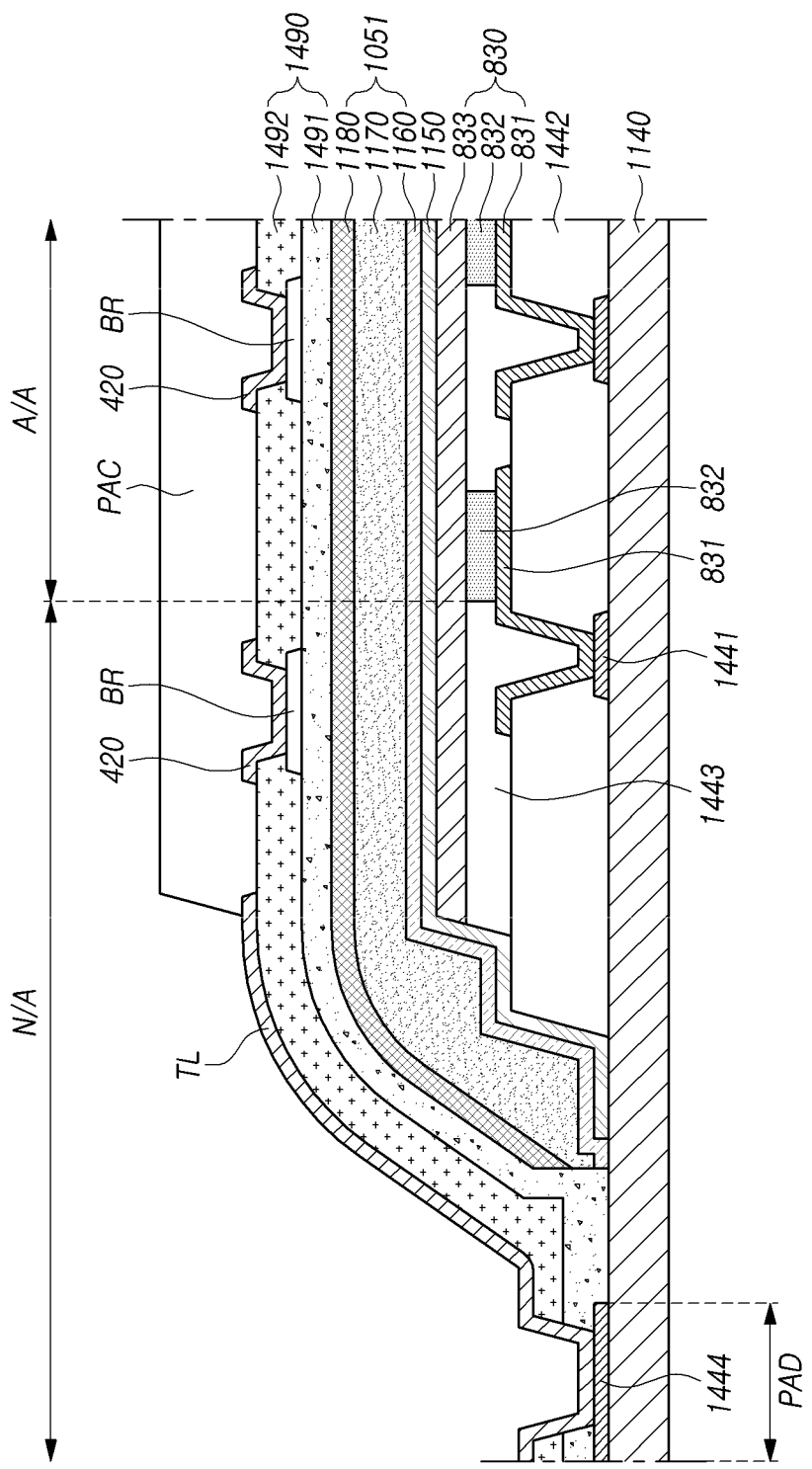
FIG. 14 illustrates an active area and a non-active area extending from the active area according to embodiments of the present disclosure.

FIG. 14 illustrates an active area and a non-active area extending from the active area according to embodiments of the present disclosure.

In the following description, some configurations, effects, etc., of the embodiments or examples discussed above may not be repeatedly described for convenience of description.

Referring to FIG. 14, a display panel in accordance with embodiments of the present disclosure may include a substrate 1140, source or drain electrodes 1441, a planarization layer 1442, a first electrode 831, a light emitting layer 832, a second electrode 833, a protective layer 1150, an encapsulation layer 1051, a touch buffer layer 1490, a touch electrode 420 and a touch planarization layer PAC.

The touch buffer layer 1490 may be, for example, formed of a plurality of layers, and include a first touch buffer layer 1491 and a second touch buffer layer 1492.

The touch electrode 420 may be contact a bridge BR such as a patterned bridge through a hole formed in the second touch buffer layer 1492.

The touch electrode 420 may be a transparent electrode or an opaque electrode.

The touch electrode 420 and a touch line TL may be disposed on the touch buffer layer 1492.

Touch electrodes arranged in an identical row (or an identical column) may form one driving touch electrode line or one touch sensing touch electrode line, by being electrically connected to one another through one or more patterned bridge(s) BR.

FIG. 14 illustrates a configuration in which the touch electrode 420 and the touch line TL are located in an identical layer, the touch electrode 420 and the touch line TL may be located in different respective layers.

The touch buffer layer 1490 in the non-active area N/A may directly contact the pressure sensitive adhesive layer 1170. Unlike the embodiments of the present disclosure, in case a separate organic layer is introduced between the protective layer 1150 and the graphene layer 1160, it is beneficial for a dam structure to be formed in the non-active area N/A to block the overflowing of the organic layer; therefore the touch buffer layer 1490 and the organic layer cannot be contact each other. However, according to the embodiments of the present disclosure, since the pressure sensitive adhesive layer 1170 planarizes the graphene layer 1160, it is unnecessary for a separate organic layer to be formed on the protective layer 1150; thus, as a dam is not needed to be formed, a size or a thickness of a bezel can be smaller or thinner, and the touch buffer layer 1490 and the pressure sensitive adhesive layer 1170 can directly contact each other.

The display panel may further include a conductive pad PAD including one or more pad electrode(s) 1444 in the non-active area N/A, and the touch buffer layer 1490 may directly contact the pressure sensitive adhesive layer 1170 between the conductive pad PAD and the active area A/A.

The touch line TL may be electrically connected to the pad electrode 1444 located in the non-active area N/A. The pad electrode 1444 may be connected to a touch sensing circuit TSC. The touch sensing circuit TSC can supply a touch driving signal to at least one of a plurality of touch electrodes 420, and can detect at least one of the presence or absence of a touch and a touch location in response to the touch driving signal.

The embodiments of the present disclosure do not require, for example, a dam used to block the overflowing of an organic layer (not shown) formed between the protective layer 1150 and the graphene layer 1160; therefore, the touch buffer layer 1490 can directly contact the pressure sensitive adhesive layer 1170 in an area between the conductive pad PAD and the active area A/A.

The display panel in accordance with embodiments of the present disclosure does not require to a dam to be formed in the non-active area N/A; thus, such a reduced non-active area N/A leads to a thickness or size of a bezel being thinner or smaller.

The embodiments of the present disclosure may be applied to a display device.

The display device 100 may include a display panel 110 and a driving circuit for driving the display panel.

In the display device in accordance with embodiments of the present disclosure, the display panel included in the display device is substantially equal to the display panel 110 in accordance with the embodiments of the present disclosure described above; therefore, discussions on the display panel 110 included in the display device will not be given repeatedly, Further, discussions on the driving circuit included in the display device in accordance with embodiments of the present disclosure has been already conducted; thus, will not be given repeatedly.

The above description has been presented to enable any person skilled in the art to make and use the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. Although the embodiments have been described for illustrative purposes, a person skilled in the art will appreciate that various modifications and applications are possible without departing from the essential characteristics of the present disclosure. For example, the specific components of the embodiments may be variously modified. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the technical concept of the present disclosure. The scope of protection of the present disclosure is to be construed according to the claims, and all technical ideas within the scope of the claims should be interpreted as being included in the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel having an active area in which a plurality of sub-pixels is arranged and a non-active area adjacent to at least one edge of the active area, the display panel comprising:
   a substrate;
   a light emitting element including a first electrode, a second electrode, and a light emitting layer between the first electrode and the second electrode, where in the first electrode is on the substrate, the light emitting layer is on the first electrode, and the second electrode is on the light emitting layer;
   a protective layer on the light emitting element and encapsulating the light emitting element;
   a graphene layer on the protective layer, the graphene layer including a graphene oxide;
   a pressure sensitive adhesive layer on the graphene layer, the pressure sensitive adhesive layer including a pressure sensitive adhesive; and
   a macromolecule film on the pressure sensitive adhesive layer, the macromolecule film having a first side and a second side opposite of the first side, the first side of the macromolecule film being adjacent to the pressure sensitive adhesive layer, the second side of the macromolecule film having thereon a nano-pattern.

2. The display panel according to claim 1, wherein the graphene oxide includes a negative graphene oxide flake, whose surfaces, in operation, have negative charges, and a positive graphene oxide flake, whose surfaces, in operation, have positive charges.

3. The display panel according to claim 2, wherein the graphene layer is formed such that a first graphene layer including the negative graphene oxide flake and the second graphene layer including the positive graphene oxide flake are alternately laminated.

4. The display panel according to claim 1, wherein the graphene layer directly contacts the protective layer.

5. The display panel according to claim 1, wherein the graphene layer has a thickness of about 0.5 μm to 4 μm.

6. The display panel according to claim 1, wherein the graphene layer has moisture permeability of about $1 \times 10^{-4}$ g/m$^2$·day or less.

7. The display panel according to claim 1, wherein the graphene layer has a refractive index of about 1.9 or more.

8. The display panel according to claim 1, wherein the graphene layer further includes a pressure sensitive adhesive.

9. The display panel according to claim 1, wherein the pressure sensitive adhesive layer has moisture permeability of about $1 \times 10^{-4}$ g/m$^2$·day to $1 \times 10^{-1}$ g/m$^2$·day.

10. The display panel according to claim 1, wherein the pressure sensitive adhesive layer has a thickness of about 50 μm to 400 μm.

11. The display panel according to claim 1, further comprising:
    a touch buffer layer on the macromolecule film; and
    a plurality of touch electrodes on the touch buffer layer, wherein the touch buffer layer directly contacts the pressure sensitive adhesive in the non-active area.

12. The display panel according to claim 10, further comprising a conductive pad with one or more pads located in the non-active area, wherein the touch buffer layer directly contacts the pressure sensitive adhesive layer in an area between the conductive pad and the active area.

13. The display panel according to claim 1, wherein the first side of the macromolecule film directly contacts the pressure sensitive adhesive layer.

14. A display device, comprising:
    a display panel, including:
        a substrate;
        a light emitting element including a first electrode on the substrate, a light emitting layer on the first electrode, and a second electrode on the light emitting layer;
        a protective layer on the light emitting element and encapsulating the light emitting element;
        a graphene layer on the protective layer and including a graphene oxide;
        a pressure sensitive adhesive layer located on the graphene layer and including a pressure sensitive adhesive; and
        a macromolecule film on the pressure sensitive adhesive layer; and
    a driving circuit for driving the display panel.

15. The display device according to claim 14, wherein the graphene oxide includes a negative graphene oxide flake, whose surfaces are negatively charged, and a positive graphene oxide flake, whose surfaces are positively charged.

16. The display device according to claim 15, wherein the graphene layer is formed such that a first graphene layer including the negative graphene oxide flake and the second graphene layer including the positive graphene oxide flake are alternately laminated.

17. The display device according to claim 14, wherein the graphene layer has a thickness of about 0.5 μm to 4 μm.

18. The display device according to claim 14, wherein the graphene layer has moisture permeability of about $1 \times 10^{-4}$ g/m$^2$·day or less.

19. The display device according to claim 14, wherein the pressure sensitive adhesive layer has moisture permeability of about $1 \times 10^{-4}$ g/m$^2$·day to $1 \times 10^{-1}$ g/m$^2$·day.

20. The display device according to claim 14, wherein the pressure sensitive adhesive layer has a thickness of about 50 nm to 400 nm.

* * * * *